(12) United States Patent
Schrod et al.

(10) Patent No.: US 9,680,082 B2
(45) Date of Patent: Jun. 13, 2017

(54) DEVICE FOR CHARGING AND DISCHARGING A CAPACITIVE ACTUATOR AND CONFIGURATION HAVING SUCH A DEVICE

(71) Applicant: CONTINENTAL AUTOMOTIVE GMBH, Hannover (DE)

(72) Inventors: Walter Schrod, Regensburg (DE); Albert Anzinger, Kehlheim (DE)

(73) Assignee: Continental Automotive GmbH, Hannover (DE)

( * ) Notice: Subject to any disclaimer, the term of this patent is extended or adjusted under 35 U.S.C. 154(b) by 420 days.

(21) Appl. No.: 14/469,795

(22) Filed: Aug. 27, 2014

(65) Prior Publication Data
US 2015/0061461 A1 Mar. 5, 2015

(30) Foreign Application Priority Data
Aug. 27, 2013 (DE) .................. 10 2013 217 037

(51) Int. Cl.
*H01L 41/08* (2006.01)
*H01L 41/04* (2006.01)
(Continued)

(52) U.S. Cl.
CPC ........ *H01L 41/042* (2013.01); *F02D 41/2096* (2013.01); *H02H 9/04* (2013.01);
(Continued)

(58) Field of Classification Search
CPC ... H02N 2/065; F02D 41/2096; H01L 41/042; H02H 9/04
(Continued)

(56) References Cited

U.S. PATENT DOCUMENTS 4,595,854 A * 6/1986 Yano ...................... H02N 2/067
  310/317
6,081,061 A 6/2000 Reineke et al.
(Continued)

FOREIGN PATENT DOCUMENTS

CN 1375115 A 10/2002
DE 19709716 A1 5/1998
(Continued)

*Primary Examiner* — Thomas Dougherty
*Assistant Examiner* — Karen B Addison
(74) *Attorney, Agent, or Firm* — Laurence A. Greenberg; Werner H. Stemer; Ralph E. Locher

(57) ABSTRACT

A device for charging and discharging a capacitive actuator connectable to an output connection has a first capacitor disposed between an input connection and a reference potential. The device has a series connection composed of a first and a second power switching element which is connected in parallel with the first capacitor. The device additionally has a first coil with a first connection connected to the center tap of the series connection, wherein the second connection of the first coil is connected to the reference potential via a third power switching element and to the output connection via a fourth power switching element. Wherein the power switching elements have diodes connected in parallel therewith such that they are reverse-biased from the input connection or the output connection to the reference potential. Wherein a connection of the fourth power switching element is connected to the input connection via a diode.

16 Claims, 1 Drawing Sheet

(51) Int. Cl.
*H02N 2/06* (2006.01)
*H02H 9/04* (2006.01)
*F02D 41/20* (2006.01)

(52) U.S. Cl.
CPC ....... *H02N 2/065* (2013.01); *F02D 2041/201* (2013.01); *F02D 2041/2068* (2013.01)

(58) Field of Classification Search
USPC ..... 310/317, 316.03, 316.01, 318, 319, 328, 310/315, 316.02, 323.01, 323.13, 323.21, 310/326, 346
See application file for complete search history.

(56) References Cited

U.S. PATENT DOCUMENTS

| | | | |
|---|---|---|---|
| 6,333,585 B1 * | 12/2001 | Hoffmann | ........... F02D 41/2096 310/316.03 |
| 6,563,252 B2 | 5/2003 | Schrod | |
| 7,015,621 B2 | 3/2006 | Mizuuchi | |
| 7,812,503 B2 * | 10/2010 | Kakehi | ................. H02M 3/158 310/316.03 |
| 2005/0155580 A1 | 7/2005 | Rohatschek | |

FOREIGN PATENT DOCUMENTS

| | | |
|---|---|---|
| DE | 19927087 A1 | 12/2000 |
| DE | 19952950 A1 | 6/2001 |
| DE | 10215630 A1 | 10/2003 |
| DE | 10328623 A1 | 1/2005 |
| DE | 10113801 B4 | 4/2007 |
| DE | 102011077799 A1 | 12/2012 |
| DE | 102012204576 A1 | 9/2013 |
| EP | 1239430 A1 | 9/2002 |
| EP | 0871230 B1 | 9/2004 |
| EP | 2028701 A2 | 2/2009 |
| FR | 2831727 A1 | 5/2003 |
| JP | 2003164170 A | 6/2003 |
| WO | 2013139757 A2 | 9/2013 |

* cited by examiner

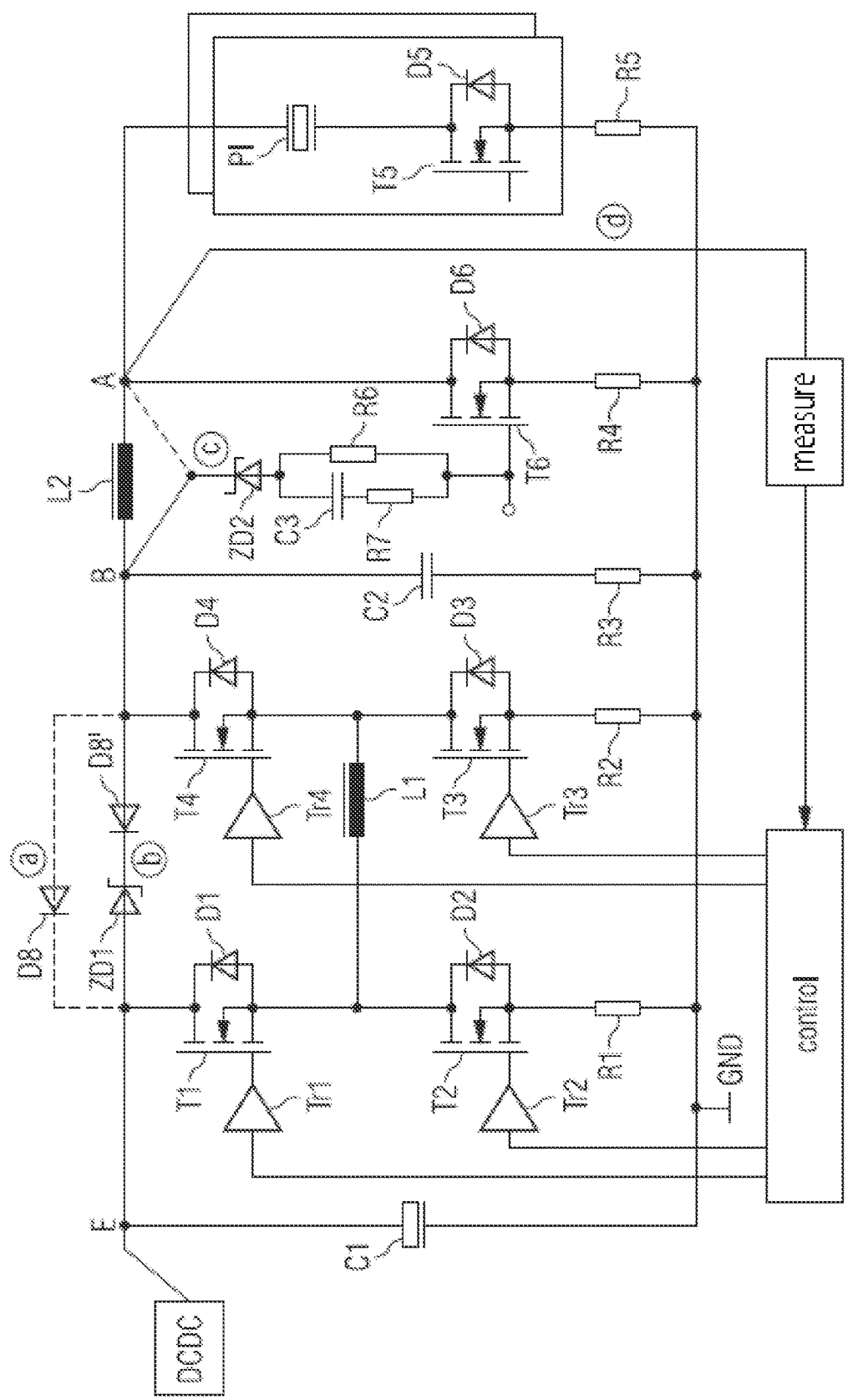

DEVICE FOR CHARGING AND DISCHARGING A CAPACITIVE ACTUATOR AND CONFIGURATION HAVING SUCH A DEVICE

CROSS-REFERENCE TO RELATED APPLICATION

This application claims the priority, under 35 U.S.C. §119, of German application DE 10 2013 217 037.8, filed Aug. 27, 2013; the prior application is herewith incorporated by reference in its entirety.

BACKGROUND OF THE INVENTION

Field of the Invention

In the case of modern internal combustion engines with fuel injection, the fuel injectors used should respond with as short a delay as possible. Capacitive actuators and, in particular in this case, capacitively acting piezo elements meet this requirement. Such capacitive actuators represent a heavy capacitive load for the corresponding voltage supply circuit, which capacitive load must be charged to a predefined voltage within a very short time and subsequently very rapidly discharged again. In addition, the actuation and hence the charging must be very precise and reproducible, with the result that a defined injection can be realized even for the smallest amounts of fuel. In order to open the corresponding fuel injector, the capacitive actuator is charged to a particular charge and, in order to close the fuel injector, the actuator is discharged again.

A device for charging and discharging, as is described in European patent EP 0 871 230 B1 (corresponding to U.S. Pat. No. 6,081,061), is necessary to actuate piezo actuators. In that document, a capacitor is charged from a DC-to-DC converter, which steps up the battery voltage of the vehicle. A piezo actuator is charged or discharged via a series connection composed of two power switching elements which is connected in parallel with the capacitor and via an inductor. However, in the case of this circuit, the piezo actuator can at most be charged to the value of the voltage across the capacitor, with the result that the DC-to-DC converter has to be configured to be appropriately powerful, which is costly.

As an alternative to this, there are actuation units for capacitive actuators which, as described in published, non-prosecuted German patent application DE 199 52 950 A1, are formed by a transformer, in the case of which actuation units energy is stored in the transformer in a first actuation phase, the energy being transferred to the capacitive actuator in a second phase by virtue of the magnetic field in the transformer decaying. This arrangement, denoted isolating transformer or flyback converter, is operated as a step-up converter and thus can provide significantly higher voltages at its output than are present at the input. However, an expensive transformer is necessary for this.

Another alternative is described in published, non-prosecuted German patent application DE 103 28 623 A1, which illustrates a combination of a step-up converter with an isolating transformer, while the output-side inductor of a step-down converter according to European patent EP 0 871 230 B1 is weakly inductively coupled to an input-side inductor. The converter circuit there is formed by power elements interconnected to form a half-bridge, however, it is also intended to be able to be operated with a full-bridge, wherein it is not apparent how the full-bridge is intended to be interconnected, however.

Published, non-prosecuted German patent application DE 102 15 630 A1 (corresponding to U.S. patent publication No. 2005/0155580) discloses a device for charging and discharging a capacitive actuator and an arrangement having such a device, in which, in addition to a switch topology according to European patent EP 0 871 230 B1, a third power switching element is interconnected between the inductor and a piezo actuator and a fourth power switching element is interconnected between the interconnection point of the third power switching element and the inductor and the reference potential. However, the fourth power switching element is used there merely for the rapid discharging of a selected piezo actuator and the third power switching element is used as group selection switch. The piezo actuator is only charged to a voltage which is below the voltage across the capacitor of the DC-to-DC converter, which is monitored by a regulating circuit, in the case of which the voltage across the piezo actuator is detected for this purpose via a voltage divider. As a result of this, an overvoltage across the piezo actuator is avoided.

In German patent application 10 2012 204 576.7, which has not previously been published, a method for operating a full-bridge topology according to published, non-prosecuted German patent application DE 102 15 630 A1 is described, in the case of which energy from the capacitor of the DC-to-DC converter is first intermediately stored in the inductor by switching on the first and the fourth power switching elements, in order subsequently to transfer the energy to a selected piezo actuator by switching off the first and fourth power switching elements, for which either the second and the third power switching elements are switched on or their substrate diodes are used as freewheeling diodes. As a result of this, in principle, any desired level of voltage can be generated across the piezo actuator.

In order to protect the piezo actuator against an overvoltage, firstly, as in published, non-prosecuted German patent application DE 102 15 630 A1, the voltage across the piezo actuator can be actively monitored and regulated or, according to published, non-prosecuted German patent application DE 197 09 716 A1, clamping to ground can take place via a Zener diode connected in parallel with the piezo actuator and its selection switch. However, monitoring is expensive and clamping to ground leads to dissipation of the excess electrical energy.

SUMMARY OF THE INVENTION

It is therefore the object of the invention to specify a device for charging and discharging a capacitive actuator and an arrangement having such a device, which avoid the disadvantages of the prior art.

The object is achieved by a device for charging and discharging a capacitive actuator which is connectable to an output connection of the device. The device has a first capacitor which is arranged between an input connection of the device and a reference potential. The device further has a first series connection composed of a first and a second power switching element which is connected in parallel with the first capacitor. The device additionally has a first coil with a first connection connected to the center tap of the first series connection. Wherein the second connection of the first coil is connected to the reference potential via a third power switching element and to the output connection via a fourth power switching element. Wherein the power switching elements have diodes connected in parallel therewith such that they are reverse-biased from the input connection or the output connection to the reference potential. Wherein a connection of the fourth power switching element, which is not connected to the first coil, is connected to the input connection via a forward-biased overvoltage protection diode.

As a result of this, the excess energy which would lead to an overvoltage across the capacitive actuator or across the piezo actuator is fed back into the capacitor in a manner according to the invention.

In a particularly advantageous development of the device, a reverse-biased first Zener diode is interconnected in series with the overvoltage protection diode between the connection of the fourth power switching element, which is not connected to the first coil, and the input connection.

As a result of this, it is possible to set, by means of the voltage value of the Zener diode, the value by which the voltage across the capacitive actuator may be greater than the voltage across the input capacitor before the excess energy is fed back into the input capacitor.

The object is also achieved by a device for charging and discharging a capacitive actuator which is connectable to an output connection of the device. The device has a first capacitor which is arranged between an input connection of the device and a reference potential. The device further has a first series connection composed of a first and a second power switching element which is connected in parallel with the first capacitor, and a first coil. The first connection of the first coil is connected to the center tap of the first series connection. Wherein the second connection of the first coil is connected to the reference potential via a third power switching element and to the output connection via a fourth power switching element. Wherein the power switching elements have diodes connected in parallel therewith such that they are reverse-biased from the input connection or the output connection to the reference potential. Wherein a sixth power switching element is arranged between the output connection and the reference potential, the control connection of the sixth power switching element being connected to the connection of the fourth power switching element or to the output connection via a clamping circuit. Wherein the clamping circuit is formed by a second Zener diode and a parallel connection composed of a sixth resistor and the series connection composed of a seventh resistor and a third capacitor. The parallel connection is connected in series with the second Zener diode. Wherein the second Zener diode is reverse-biased between the connection of the fourth power switching element or the output connection and the control connection of the sixth power switching element.

By means of the clamping circuit, the sixth power switching element can be rapidly activated, wherein the switch-on voltage can be set by the Zener diode and the dynamic behavior can be set by the RC filter element.

The object is also achieved by a configuration having a device for charging and discharging a capacitive actuator and having at least one capacitive actuator which is arranged between the output connection of the device and the reference potential.

In an advantageous development of the invention, a low pass filter formed by a capacitor and a coil is arranged between the full-bridge circuit and the output connection of the device in order to smooth current and voltage peaks caused by the switching of the power switching elements.

A plurality of capacitive actuators in a parallel connection can be connected to the device according to the invention, wherein a selection switching element is advantageously arranged in series with each capacitive actuator, with the result that the actuators can be actuated in a targeted manner.

Other features which are considered as characteristic for the invention are set forth in the appended claims.

Although the invention is illustrated and described herein as embodied in a device for charging and discharging a capacitive actuator and arrangement having such a device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing shows a basic circuit diagram of an arrangement according to the invention having a device according to the invention.

DETAILED DESCRIPTION OF THE INVENTION

Referring now to the single FIGURE of the drawing in detail, there is shown a device configured to charge and discharge a capacitive actuator configured as a piezo injector PI. In the case of which device, a first capacitor C1 which is arranged between an input connection E and a reference potential GND is connected to a DC-to-DC converter DCDC—not belonging to the device according to the invention—and can be charged to an input voltage by the DC-to-DC converter. For its part, the DC-to-DC converter DCDC generates the correspondingly required input voltage of the device from, for example, the battery voltage of a motor vehicle.

The series connection composed of a first power switching element configured as an n-channel MOS power transistor T1, a second power switching element likewise configured as an n-channel MOS power transistor T2 and a first current measuring element R1 configured as a shunt resistor is interconnected in parallel with the first capacitor C1. The first connection of a first coil L1 is connected to the center tap of the first series connection composed of the first and second power switching elements T1, T2, while the second connection of the first coil L1 is connected, on one side, to the reference potential GND via a third power switching element configured as an n-channel MOS power transistor T3 and via a second current measuring element R2 which is configured as a shunt resistor and is connected in series with the third power switching element.

On the other side, the second connection of the first coil L1 is connected to the output connection A of the device via a fourth power switching element likewise configured as an n-channel MOS power transistor T4 and via a second coil L2 which is connected in series with the fourth power switching element. The connection B of the fourth power switching element T4, which is not connected to the first coil L1, is connected to the reference potential GND via a second capacitor C2 and a third current measuring element R3 configured as a shunt resistor.

The second capacitor C2 and the second coil L2 form a low-pass filter in order to filter current and voltage peaks occurring owing to the switching processes of the power switching elements T1-T4.

Instead of shunt resistors, the current measuring elements R1 to R3 and also further current measuring elements can also be formed by current mirrors or any other means for current detection familiar to a person skilled in the art. Although they have been provided in all current branches leading to the reference potential GND in the illustration in the FIGURE, they can also be partially omitted, however, if a corresponding current is not of interest, or they can be provided in other branches.

In particular, in configurations of the invention, the second and the third power switching elements T2, T3 or the third power switching element T3 and the second capacitor C2 can be connected to the reference potential GND via only in each case one common current measuring element, since a current does not simultaneously flow through the corresponding current paths during intended operation.

The series connection composed of a capacitive actuator configured as a piezo actuator P1 and of a selection power switching element T5, which is likewise configured as an n-channel MOS power transistor, and of a fifth current measuring element R5 likewise configured as a shunt resistor is arranged between the output connection A of the device and the reference potential GND in the circuit illustrated in the FIGURE.

By means of a border surrounding the series connection composed of the piezo injector P1 and the selection power switching element T5 and a border illustrated behind this, it is indicated that a plurality of such piezo injectors can be connected in parallel with the one illustrated to the device and one of them can be selected by appropriate actuation of the associated selection switch T5. In the case of a plurality of parallel-connected piezo injectors PI, each can have a series-connected shunt resistor or else all of the piezo injectors can be connected to the illustrated shunt resistor R5. This is possible since only one piezo injector is usually selected at one time.

A sixth power switching element T6 is interconnected in series with a fourth current measuring element R4 configured as a shunt resistor between the output connection A of the device according to the invention and the reference potential. By the sixth power switching element T6, the piezo injector or injectors can be rapidly discharged, if appropriate.

The shunt resistors R1-R5 are used to detect the current flowing through the respective current branch in order to be able to use the voltage dropping across the shunt resistors to regulate the voltage across the piezo injector in a control circuit control. For this purpose, the control circuit control actuates the control inputs of the power switching elements T1-T4 in a known manner via corresponding lines and driver circuits TR1-TR4. The connection lines from corresponding taps of the shunt resistors R1 to R5 to the control circuit control have been omitted for reasons of clarity.

A diode D1-D6 is connected in each case in parallel with the power switching elements T1-T6 and, what is more, in such a manner that they are interconnected in a reverse-biased manner between the input connection E and the reference potential GND or between the output connection A and the reference potential GND. When the illustrated n-channel MOS power transistors are used, the diodes D1-D6 are often present as intrinsic diodes on account of the technology.

In order to charge a piezo injector PI, firstly the first and the third n-channel MOS power transistors T1, T3 are actuated so as to conduct by the control circuit control, with the result that a current can flow from the first capacitor C1 via the first coil L1, as a result of which energy is stored in the coil L1. The current through the first coil L1 usually increases linearly, wherein, when a predefined maximum current value—which is calculated by the third shunt resistor R3—is reached, the previously switched-on power transistors T1, T3 are switched off again. The magnetic energy stored in the first coil L1 dissipates via a flow of current through the diode D2 of the second power transistor T2 and the diode D4 of the fourth power transistor T4, which flow of current flows in a manner smoothed by the filter circuit C2, L2 into the piezo injector PI selected by actuation of the fifth power transistor T5 and charges said piezo injector to a corresponding voltage. By means of repeated switching on and off of the first and third power transistors T1, T3, the piezo injector can be charged to a predefined voltage by the number and duration of the switch-on processes according to the measurement of the voltage across the piezo injector PI by the control circuit control.

In order to discharge, the second and the fourth power transistors T2, T4 are correspondingly switched on by the control circuit control, with the result that now a current can flow from the piezo injector PI to the reference potential GND via the second coil L2 and the first coil L1. After the second and fourth power transistors T2, T4 have been switched off, the magnetic energy stored in the first coil L1 is intermediately stored in the first capacitor C1 via the intrinsic diodes D1, D3 of the first and third power transistors T1, T3.

Since a current also flows through the second (filter) capacitor C2 to the reference potential GND when the piezo injector PI is discharged, the third current measuring element R3 is provided in order to be able to calculate the precise charge taken from the piezo injector PI from the sum of the currents through the second power switching element T2 and via the second capacitor C2.

In a manner according to the invention, the connection B of the fourth power switching element T4, in accordance with an embodiment illustrated with a dashed line in the FIGURE and denoted by an a in a circle, is connected to the input connection E via a forward-biased overvoltage protection diode D8. As a result of this, excess energy stored in the first coil L1, which could lead to an overvoltage across the piezo injector PI, can be fed back into the first capacitor C1 in a manner which is simple in terms of circuitry.

An alternative embodiment being a development according to the invention is denoted with a b in a circle. In this case, in addition to the forward-biased overvoltage protection diode D8, a first Zener diode ZD1 connected in series therewith is interconnected in the reverse direction between the connection B of the fourth power switching element T4 and the input connection E. By means of the first Zener diode ZD1, a desired voltage in the form of the Zener voltage can be set, which, when added to the voltage across the first capacitor C1, results in the overvoltage across the piezo injector PI, from which feedback into the first capacitor C1 takes place via the overvoltage diode D8 and the first Zener diode ZD1 which is operated in Zener breakdown.

As another independent possibility of achieving overvoltage protection across the piezo injector PI, an embodiment is illustrated in the FIGURE with a c in a circle, in the case of which embodiment the control connection of the sixth power switching element T6 is connection to the connection B of the fourth power switching element T4 via a clamping circuit or —illustrated with a dashed line—alternatively is connected to the output connection A. The clamping circuit is in this case formed by a second Zener diode ZD2 and a parallel connection composed of a sixth resistor R6 and the series connection composed of a seventh resistor R7 and a third capacitor C3, which parallel connection is connected in series with the second Zener diode. The second Zener diode ZD2 is reverse-biased between the connection B or the output connection A and the control connection of the sixth power switching element T6, that is to say it is operated as intended in Zener breakdown, as a result of which the sixth power switching element T6 starts to conduct and enables a flow of current to the reference potential GND from a overvoltage at the connection B or at the output connection A, which overvoltage is predefined by the Zener voltage which can be set.

Finally, as another alternative, the possibility known from the prior art is illustrated, which involves detecting the voltage across the piezo injector PI by a measurement circuit measure and to regulate it to a predefined value by actuation of the first to fourth power switching elements T1-T4.

The invention claimed is:

1. A device for charging and discharging a capacitive actuator, the device comprising:
    an output connection to be connected to the capacitive actuator;
    an input connection;
    a reference potential connection;
    a first capacitor disposed between said input connection and said reference potential connection;
    a first series connection containing a first power switching element, a second power switching element and a center tap, said first series connection connected in parallel with said first capacitor;
    a third power switching element;
    a fourth power switching element;
    a first coil having a first connection connected to said center tap of said first series connection and a second connection coupled to said reference potential connection via said third power switching element and to said output connection via said fourth power switching element;
    said first through fourth power switching elements having diodes connected in parallel therewith such that said diodes are reverse-biased from said input connection or said output connection to said reference potential connection;
    a forward-biased overvoltage protection diode; and
    said fourth power switching element having a connection, which is not connected to said first coil, connected to said input connection via said forward-biased overvoltage protection diode.

2. The device according to claim 1, further comprising a reverse-biased first Zener diode interconnected in series with said forward-biased overvoltage protection diode between said connection of said fourth power switching element, which is not connected to said first coil, and said input connection.

3. The device according to claim 1, further comprising a further power switching element disposed between said output connection and said reference potential connection.

4. The device according to claim 1, further comprising:
    a second coil; and
    a second capacitor, said connection of said fourth power switching element, which is not connected to said first coil, is connected to said output connection via said second coil and to said reference potential connection via said second capacitor.

5. The device according to claim 1, wherein said first through fourth power switching elements are power MOS transistors.

6. A device for charging and discharging a capacitive actuator (P1), the device comprising:
    an output connection to be connected to the capacitive actuator;
    an input connection;
    a reference potential connection;
    a first capacitor disposed between said input connection and said reference potential connection;
    a first series connection containing a first power switching element, a second power switching element and a center tap, said first series connection connected in parallel with said first capacitor;
    a third power switching element;
    a fourth power switching element having a connection;
    a first coil having a first connection connected to said center tap of said first series connection and a second connection connected to said reference potential connection via said third power switching element and to said output connection via said fourth power switching element;
    said first through fourth power switching elements having diodes connected in parallel therewith such that said diodes being reverse-biased from said input connection or said output connection to said reference potential connection;
    a clamping circuit;
    a further power switching element disposed between said output connection and said reference potential connection, said further power switching element having a control connection connected to said connection of said fourth power switching element or to said output connection via said clamping circuit; and
    said clamping circuit having a second Zener diode and a parallel connection composed of a sixth resistor and a series connection containing a seventh resistor and a third capacitor, said parallel connection being connected in series with said second Zener diode, wherein said second Zener diode is reverse-biased between said connection of said fourth power switching element or said output connection and said control connection of said further power switching element.

7. The device according to claim 6, further comprising:
    a second coil; and
    a second capacitor, said connection of said fourth power switching element, which is not connected to said first coil, is connected to said output connection via said second coil and to said reference potential connection via said second capacitor.

8. The device according to claim 6, wherein said first through fourth power switching elements are power MOS transistors.

9. A configuration, comprising:
    at least one capacitive actuator;
    a device for charging and discharging said capacitive actuator, said device comprising:
        an output connection to be connected to said capacitive actuator;
        an input connection;
        a reference potential connection;
        a first capacitor disposed between said input connection and said reference potential connection;
        a first series connection containing a first power switching element, a second power switching element and a center tap, said first series connection connected in parallel with said first capacitor;
        a third power switching element;
        a fourth power switching element;

a first coil having a first connection connected to said center tap of said first series connection and a second connection connected to said reference potential connection via said third power switching element and to said output connection via said fourth power switching element;

said first through fourth power switching elements having diodes connected in parallel therewith such that said diodes are reverse-biased from said input connection or said output connection to said reference potential connection;

a forward-biased overvoltage protection diode;

said fourth power switching element having a connection, which is not connected to said first coil, connected to said input connection via said forward-biased overvoltage protection diode; and said at least one capacitive actuator disposed between said output connection and said reference potential connection.

10. The configuration according to claim 9, further comprising a current measuring element, said capacitive actuator is connected to said reference potential connection via said current measuring element.

11. The configuration according to claim 10, further comprising a fifth power switching element, said capacitive actuator is connected to said reference potential connection via said fifth power switching element.

12. The configuration according to claim 9, wherein said capacitive actuator is a piezo actuator.

13. A configuration, comprising:
at least one capacitive actuator; and
a device for charging and discharging said capacitive actuator, said device containing:
an output connection to be connected to the capacitive actuator;
an input connection;
a reference potential connection;
a first capacitor disposed between said input connection and said reference potential connection;
a first series connection containing a first switching element, a second power switching element and a center tap, said first series connection connected in parallel with said first capacitor;
a third power switching element;
a fourth power switching element having a connection;
a first coil having a first connection connected to said center tap of said first series connection and a second connection connected to said reference potential connection via said third power switching element and to said output connection via said fourth power switching element;

said first through fourth power switching elements having diodes connected in parallel therewith such that said diodes being reverse-biased from said input connection or said output connection to said reference potential connection;

a clamping circuit;

a further power switching element disposed between said output connection and said reference potential connection, said further power switching element having a control connection connected to said connection of said fourth power switching element or to said output connection via said clamping circuit;

said clamping circuit having a second Zener diode and a parallel connection composed of a sixth resistor and a series connection containing a seventh resistor and a third capacitor, said parallel connection being connected in series with said second Zener diode, wherein said second Zener diode is reverse-biased between said connection of said fourth power switching element or said output connection and said control connection of said further power switching element; and said at least one capacitive actuator disposed between said output connection and said reference potential connection.

14. The configuration according to claim 13, further comprising a current measuring element, said capacitive actuator is connected to said reference potential connection via said current measuring element.

15. The configuration according to claim 14, further comprising a power switching element, said capacitive actuator is connected to said reference potential connection via said power switching element.

16. The configuration according to claim 13, wherein said capacitive actuator is a piezo actuator.

* * * * *